US008989899B2

(12) United States Patent
Ando et al.

(10) Patent No.: US 8,989,899 B2
(45) Date of Patent: Mar. 24, 2015

(54) TRANSFER SYSTEM

(75) Inventors: Ryuji Ando, Fukuoka (JP); Kazunori Hino, Fukuoka (JP); Shinichi Katsuda, Fukuoda (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 281 days.

(21) Appl. No.: 13/607,806

(22) Filed: Sep. 10, 2012

(65) Prior Publication Data
US 2013/0184862 A1 Jul. 18, 2013

(30) Foreign Application Priority Data
Jan. 13, 2012 (JP) .................. 2012-005332

(51) Int. Cl.
*B08B 3/04* (2006.01)
*G03D 5/00* (2006.01)
(52) U.S. Cl.
USPC ........ 700/245; 414/226.01; 438/795; 134/18; 118/666
(58) Field of Classification Search
USPC ................ 700/245, 108; 414/226.01, 225.01; 438/795; 427/240; 134/18; 118/663, 118/666
See application file for complete search history.

(56) References Cited

U.S. PATENT DOCUMENTS

| 5,297,910 | A * | 3/1994 | Yoshioka et al. ........ 414/226.01 |
| 6,054,181 | A * | 4/2000 | Nanbu et al. .................. 427/240 |
| 6,877,946 | B2 * | 4/2005 | Kinnard et al. .............. 414/805 |
| 6,969,227 | B2 * | 11/2005 | Kinnard et al. ............ 414/744.2 |
| 2003/0035711 | A1 | 2/2003 | Gilchrist |
| 2003/0190823 | A1 * | 10/2003 | Keeton et al. ................. 438/795 |

FOREIGN PATENT DOCUMENTS

| JP | 04-262555 | 9/1992 |
| JP | 2960151 B2 | 9/1992 |
| JP | 2002-110761 | 4/2002 |
| JP | 2002-343847 | 11/2002 |
| JP | 2003-179119 | 6/2003 |
| JP | 2004-535681 | 11/2004 |
| JP | 2004-356295 | 12/2004 |
| JP | 2009-078805 | 4/2009 |
| JP | 2011-205044 | 10/2011 |
| TW | 516154 B | 1/2003 |

OTHER PUBLICATIONS

Japanese Office Action for corresponding JP Application No. 2012-005332, Nov. 26, 2013.
Korean Office Action for corresponding KR Application No. 10-2012-0118063, Jul. 3, 2014.
Japanese Decision of a Patent Grant for corresponding JP Application No. 2012-005332, Aug. 5, 2014.

(Continued)

*Primary Examiner* — Ronnie Mancho
(74) *Attorney, Agent, or Firm* — Mori & Ward, LLP

(57) ABSTRACT

A transfer system according to an embodiment includes a robot and a determination unit. The robot includes robot hands that hold a workpiece in a thin plate shape and that are located at different heights. The determination unit determines the robot hands that hold the workpiece based on a combination of temperature of the workpiece to be held by each of the robot hands.

12 Claims, 8 Drawing Sheets

(56) References Cited

OTHER PUBLICATIONS

Chinese Office Action for corresponding CN Application No. 201210405661.3, 08-28-20104.

Taiwanese Office Action for corresponding TW Application No. 101137453, Jan. 15, 2015.

* cited by examiner

FIG.5

| TEMPERATURE CHANGE ALLOWANCE POSSIBILITY | TEMPERATURE TYPE | | DOWNFLOW | UPPER HAND | LOWER HAND | ... | |
|---|---|---|---|---|---|---|---|
| IMPOSSIBLE | ABNORMAL TEMPERATURE | HIGH TEMPERATURE | STRONG | BEFORE PROCESSING | AFTER PROCESSING | ... | ← P1 |
| | | | WEAK | AFTER PROCESSING | BEFORE PROCESSING | ... | ← P2 |
| | | LOW TEMPERATURE | ARBITRARY | BEFORE PROCESSING | AFTER PROCESSING | ... | ← P3 |
| | NORMAL TEMPERATURE | | ARBITRARY | ARBITRARY | ARBITRARY | ... | ← P4 |
| POSSIBLE | ARBITRARY | | ARBITRARY | ARBITRARY | ARBITRARY | ... | ← P5 |

TRANSFER SYSTEM

CROSS-REFERENCE TO RELATED APPLICATION

This application is based upon and claims the benefit of priority of the prior Japanese Patent Application No. 2012-005332, filed on Jan. 13, 2012, the entire contents of which are incorporated herein by reference.

FIELD

The embodiment discussed herein is directed to a transfer system.

BACKGROUND

Conventionally widely known are transfer systems that include a local clean device referred to as an equipment front end module (EFEM) and that carry a substrate, such as a wafer, in and out of a processing device in a semiconductor manufacturing process from and to a space formed in the EFEM.

Transfer systems typically include an arm body. Such transfer systems transfer a substrate by moving the arm body in a horizontal direction with the substrate placed and held on the arm body or an end effector provided to the tip of the arm body, for example.

In each processing in the semiconductor manufacturing process, such as washing processing, deposition processing, and photolithography processing, a substrate may be exposed to an environment of high heating, supercooling, and the like, and the substrate is often at abnormal temperature after the processing.

To address this, Japanese Patent Application Laid-open No. 2002-343847, for example, discloses a wafer transfer apparatus that includes two arm bodies arranged in two tiers and that uses an upper arm body only for a substrate at high temperature after the processing and uses a lower arm body only for a substrate at normal temperature before the processing.

In the conventional transfer system, however, the temperature of the substrate after the processing may possibly affect the substrate before the processing. The state of the substrate at abnormal temperature includes a state at low temperature besides a state at high temperature, for example. If such a substrate at low temperature is placed on the upper arm body, cold air descends because of heat convection. As a result, the substrate is highly likely to affect a substrate at normal temperature placed on the lower arm body.

To address this, the two arm bodies may be used in an opposite manner to the case where the substrate after the processing is at high temperature. However, to transfer another substrate at high temperature, the two arm bodies need to be used in a further opposite manner, thereby making the processing complicated.

Furthermore, in the EFEM described above, a downflow device often creates downflow of clean air because of the need to maintain the space with an extremely clean air. In this case, the heat convection is made complicated, thereby making it difficult for the conventional transfer system to deal with the circumstances.

SUMMARY

A transfer system according to an embodiment includes a robot and a determination unit. The robot includes robot hands that hold a workpiece in a thin plate shape and that are located at different heights. The determination unit determines the robot hands that hold the workpiece based on a combination of temperature of the workpiece to be held by each of the robot hands.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 5 is a view of an example of combination information.

DESCRIPTION OF EMBODIMENT

Exemplary embodiments of a transfer system disclosed in the present application are described below in greater detail with reference to the accompanying drawings. It is to be noted that the embodiments below are not intended to limit the present invention.

In the description below, an explanation will be made of the case where a workpiece serving as a target to be transferred is a substrate and the substrate is a semiconductor wafer. The "semiconductor wafer" is referred to as a "wafer". A "robot hand" serving as an end effector is referred to as a "hand".

Figure 1:
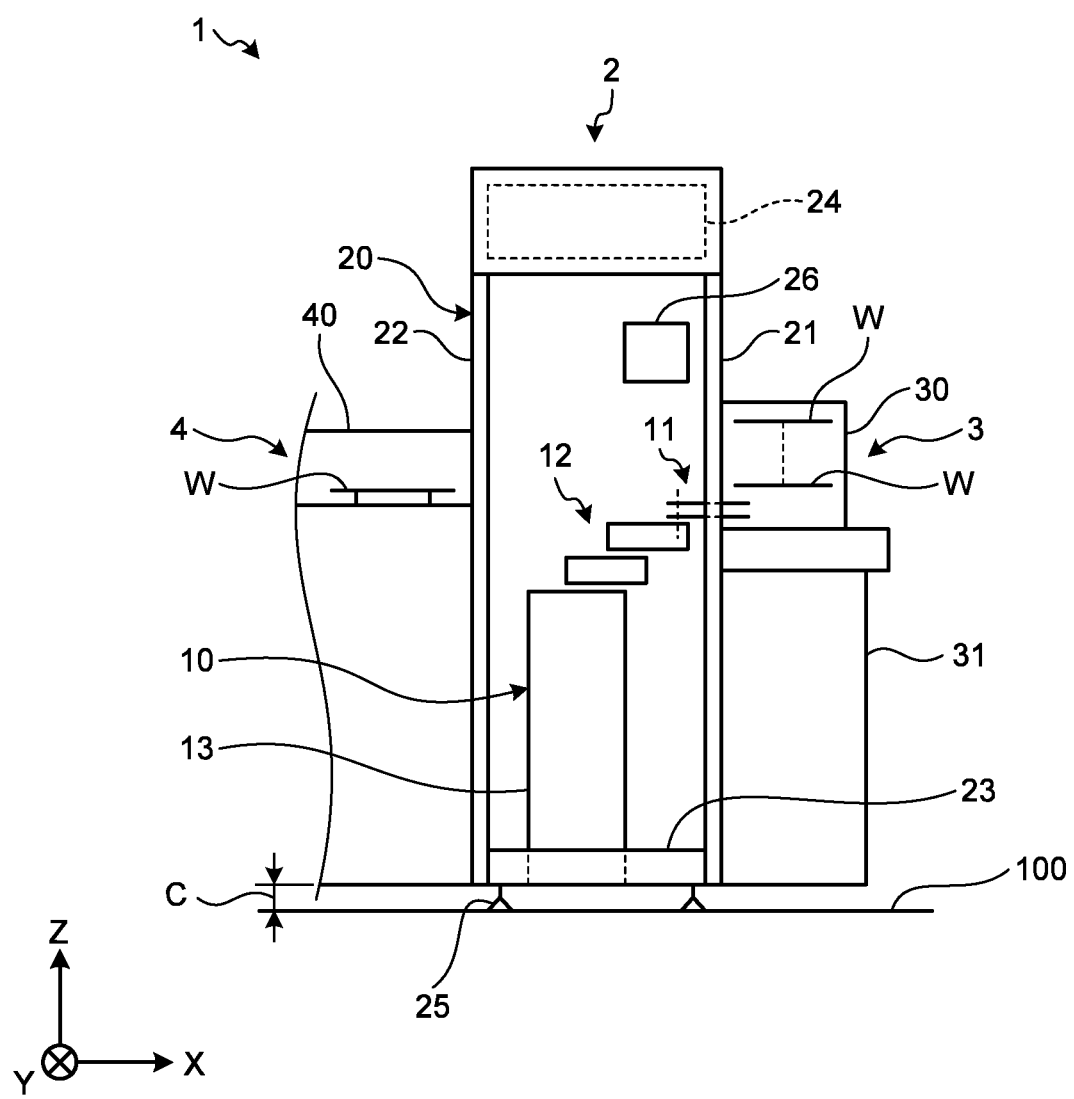
FIG. 1 is a schematic of a whole configuration of a transfer system according to an embodiment.

A whole configuration of a transfer system according to an embodiment will now be described with reference to FIG. 1. FIG. 1 is a schematic of a whole configuration of a transfer system 1 according to the embodiment.

For convenience of the explanation, FIG. 1 illustrates a three-dimensional rectangular coordinate system including a Z-axis in which a vertically upward direction is a positive direction and a vertically downward direction (that is, a "vertical direction") is a negative direction. Therefore, a direction along an X-Y plane corresponds to a "horizontal direction". The rectangular coordinate system may be illustrated in other figures used for explanations below.

In the description below, for a component provided in plurality, a reference numeral may be assigned only to one component of the components, and allocation of reference numerals to the others may be omitted. In this case, the one to which the reference numeral is assigned has the same configuration as those of the others.

As illustrated in FIG. 1, the transfer system 1 according to the embodiment includes a substrate transfer unit 2, a substrate supply unit 3, and a substrate processing unit 4. The substrate transfer unit 2 includes a robot 10 and a housing 20 provided with the robot 10 inside thereof. The substrate supply unit 3 is provided to a side surface 21 on one side of the housing 20, and the substrate processing unit 4 is provided to a side surface 22 on the other side of the housing 20. A reference numeral 100 in FIG. 1 denotes an installation surface of the transfer system 1.

The robot 10 includes an arm unit 12 with a hand 11 that can hold a wafer W, which is a target to be transferred, in two tiers. The arm unit 12 is supported by a base 13 arranged on a base installation frame 23 functioning as the bottom wall of the housing 20 in an ascendable and descendable manner and in a rotatable manner in the horizontal direction. The robot 10 will be described later in detail with reference to FIG. 2.

The housing 20 is a so-called EFEM, and creates downflow of clean air via a filter unit 24 provided to the upper part of the housing 20. The downflow keeps the inside of the housing 20 in a highly clean state. Furthermore, a leg 25 is provided to the lower surface of the base installation frame 23, and supports the housing 20 with a predetermined clearance C interposed between the housing 20 and the installation surface 100.

The substrate supply unit 3 includes a hoop 30 that houses a plurality of wafers W in a multistage manner in a height direction and a hoop opener (not illustrated) that opens and closes a lid of the hoop 30 to allow the wafer W to be brought into the housing 20. The set of the hoop 30 and the hoop opener can be provided in plurality in a manner arranged in parallel at predetermined intervals on a table 31 having a predetermined height.

The substrate processing unit 4 is a processing unit that performs predetermined processing in a semiconductor manufacturing process, such as washing processing, deposition processing, and photolithography processing, on the wafer W. The substrate processing unit 4 includes a processing device 40 that performs the predetermined processing. The processing device 40 is provided to the side surface 22 on the other side of the housing 20 in a manner facing the substrate supply unit 3 with the robot 10 interposed therebetween.

A pre-aligner device 26 that performs centering and notch alignment on the wafer W is provided inside of the housing 20.

With this configuration, in the transfer system 1 according to the embodiment, the robot 10 takes the wafer W out of the hoop 30 while performing an ascending and descending operation and a rotating operation, and carries the wafer W in the processing device 40 via the pre-aligner device 26. The robot 10 then carries and transmits the wafer W subjected to the predetermined processing in the processing device 40 out of the processing device 40, and houses the wafer W in the hoop 30 again.

Figure 2:
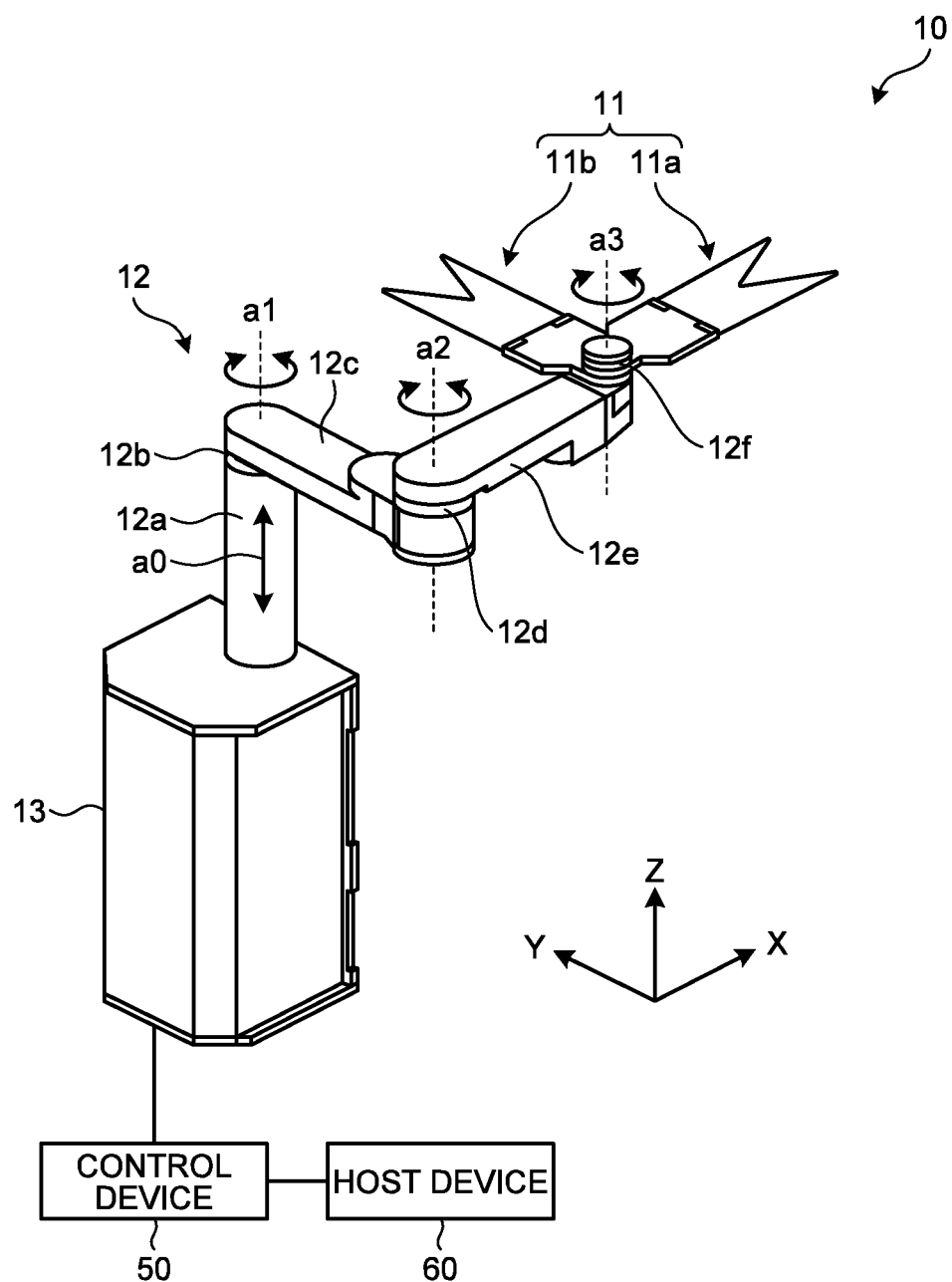
FIG. 2 is a schematic of a configuration of a robot according to the embodiment.

A configuration of the robot 10 according to the embodiment will now be described with reference to FIG. 2. FIG. 2 is a schematic of a configuration of the robot 10 according to the embodiment.

As illustrated in FIG. 2, the robot 10 according to the embodiment includes the hand 11, the arm unit 12, and the base 13. The arm unit 12 includes an ascending and descending unit 12a, joints 12b, 12d, and 12f, a first arm 12c, and a second arm 12e.

As described above, the base 13 is a base portion of the robot 10 and is arranged on the base installation frame 23 (refer to FIG. 1). The ascending and descending unit 12a is provided in a slidable manner in the vertical direction (Z-axis direction) from the base 13 (refer to a double-headed arrow a0 in FIG. 2), and causes the arm unit 12 to ascend and descend along the vertical direction.

The joint 12b is a rotary joint about an axis a1 (refer to a double-headed arrow about the axis a1 in FIG. 2). The first arm 12c is rotatably connected to the ascending and descending unit 12a via the joint 12b.

The joint 12d is a rotary joint about an axis a2 (refer to a double-headed arrow about the axis a2 in FIG. 2). The second arm 12e is rotatably connected to the first arm 12c via the joint 12d.

The joint 12f is a rotary joint about an axis a3 (refer to a double-headed arrow about the axis a3 in FIG. 2). The hand 11 is rotatably connected to the second arm 12e via the joint 12f.

The robot 10 is provided with a driving source such as a motor, which is not illustrated, and the joint 12b, the joint 12d, and the joint 12f are rotated by the drive of the driving source.

The hand 11 is an end effector that holds the wafer W, and is formed of two hands of an upper hand 11a and a lower hand 11b located at different heights. The upper hand 11a and the lower hand 11b are provided close to each other sharing the axis a3 as a pivot, and can rotate individually about the axis a3.

The transfer system 1 according to the embodiment places the wafer W on the upper hand 11a and the lower hand 11b, and causes the robot 10 to transmit the two wafers W simultaneously, thereby making the operation more efficient and improving the throughput.

Configurations of the upper hand 11a and the lower hand 11b will be described later in detail. In the embodiment, an explanation will be made of the case where the upper hand 11a has the same configuration as that of the lower hand 11b. This is not intended to limit the configurations of the upper hand 11a and the lower hand 11b to the same configuration.

Various types of operations performed by the robot 10 are controlled by a control device 50. The control device 50 is connected to the robot 10 in an intercommunicable manner, and is arranged at a space near the robot 10 in the housing 20 (refer to FIG. 1) or outside the housing 20, for example. The control device 50 may be integrated with the robot 10.

The control device 50 controls the various types of operations performed by the robot 10 based on instruction data stored in the control device 50 in advance. Alternatively, the control device 50 may acquire the instruction data from a host device 60 also connected to the control device 50 in an intercommunicable manner. The host device 60 can monitor the state of the robot 10 (and the components thereof) successively.

In the embodiment, for convenience of the explanation, the control device 50 receives the instruction data and notification of the state of the robot 10 from the host device 60, for example. This is not intended to limit the distributed processing aspect in the transfer system 1.

Figure 3:
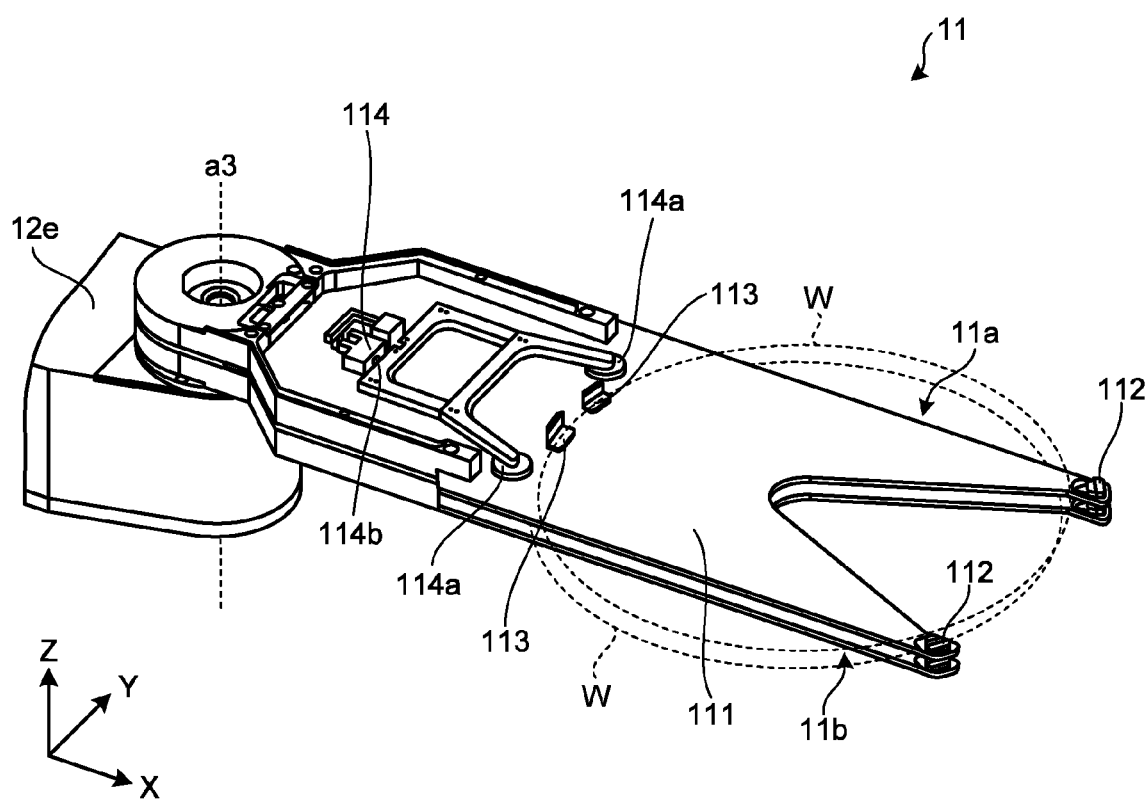
FIG. 3 is a schematic perspective view of a hand according to the embodiment.

The configuration of the hand 11 according to the embodiment will now be described in detail with reference to FIG. 3. FIG. 3 is a schematic perspective view of the hand 11 according to the embodiment. In FIG. 3, the tips of both the upper hand 11a and the lower hand 11b are directed in the positive direction of the X-axis.

In the explanation with reference to FIG. 3, the upper hand 11a is mainly described, and an explanation of the lower hand 11b having the same configuration is omitted. In the description below, the "hand 11" represents both the upper hand 11a and the lower hand 11b.

As illustrated in FIG. 3, the hand 11 is formed of the upper hand 11a and the lower hand 11b provided close to each other sharing the axis a3 as a pivot at the tip of the second arm 12e. As illustrated in FIG. 3, the upper hand 11a is arranged on the upper side and the lower hand 11b is located on the lower side.

The upper hand 11a includes a plate 111, a tip side supporting unit 112, a base end side supporting unit 113, a pressing driving unit 114, and a pressing unit 114a. The pressing driving unit 114 includes a projecting unit 114b.

The plate 111 is a member corresponding to a bottom portion or a base portion on which the wafer W is placed. While FIG. 3 illustrates the plate 111 whose tip is formed in a V-shape, it is not intended to limit the shape of the plate 111.

In consideration of placement of the wafer W at abnormal temperature, a heat-resistant material, such as ceramic and a fiber-reinforced plastic, is suitably used for the material of the plate 111.

The tip side supporting unit 112 is arranged at the tip of the plate 111. The base end side supporting unit 113 is arranged at the base end of the plate 111. In FIG. 3, a pair of tip side supporting units 112 and a pair of base end side supporting units 113 are arranged, for example.

As illustrated in FIG. 3, the wafer W is placed between the tip side supporting unit 112 and the base end side supporting unit 113. At this time, the tip side supporting unit 112 and the base end side supporting unit 113 hold the wafer W mainly by frictional force while supporting the wafer W from below with the wafer W separated from the plate 111.

Therefore, in consideration of placement of the wafer W at abnormal temperature, the tip side supporting unit 112 and the base end side supporting unit 113 that come into contact with the wafer W are preferably made of a super heat-resistant material, such as polyimide resin. The shapes of the tip side supporting unit 112 and the base end side supporting unit 113 are not restricted in particular as long as the tip side supporting unit 112 and the base end side supporting unit 113 have a surface coming into contact with the wafer W at least in the horizontal direction and the vertical direction.

The pressing driving unit 114 is a driving mechanism that causes the pressing unit 114a to move linearly along the X-axis direction by projecting the projecting unit 114b, and is formed by using an air cylinder, for example. The shapes of the pressing driving unit 114, the pressing unit 114a, and other members related to the pressing driving unit 114 illustrated in FIG. 3 are given just as an example, and are not intended to limit the shapes thereof.

The pressing driving unit 114 and the pressing unit 114a constitute a holding mechanism that holds the wafer W together with the tip side supporting unit 112.

Specifically, the pressing driving unit 114 projects the projecting unit 114b, thereby causing the pressing unit 114a to press a peripheral edge of the wafer W. As a result, the wafer W is thrust in the positive direction of the X-axis, and a peripheral edge of the wafer W on the opposite side to the side thus pressed is brought into contact with a side wall of the tip side supporting unit 112.

Thus, the wafer W is sandwiched and held between the pressing unit 114a and the tip side supporting unit 112 with predetermined pressing force.

If the wafer W is at abnormal temperature, the wafer W is likely to cause warpage and breakage. In consideration of this property, the holding method may be changed as follows: to hold the wafer W at abnormal temperature, the wafer W is held mainly by frictional force without operating the holding mechanism; and to hold the wafer W at normal temperature, the holding mechanism is operated to hold the wafer W by predetermined pressing force.

As described above, the hand 11 has a two-tiered structure. Therefore, if the tips of both the upper hand 11a and the lower hand 11b are directed in nearly the same direction with the wafers W held on the upper hand 11a and the lower hand 11b as illustrated in FIG. 3, the wafers W are close to each other.

In this case, to prevent the wafers W from affecting each other by the temperature thereof, the transfer system 1 according to the embodiment determines the hand 11 that holds each of the wafers W based on combination of the temperature of the wafers W to be held by the hand 11. An example of a control method in this case will be mainly described below.

Figure 4:
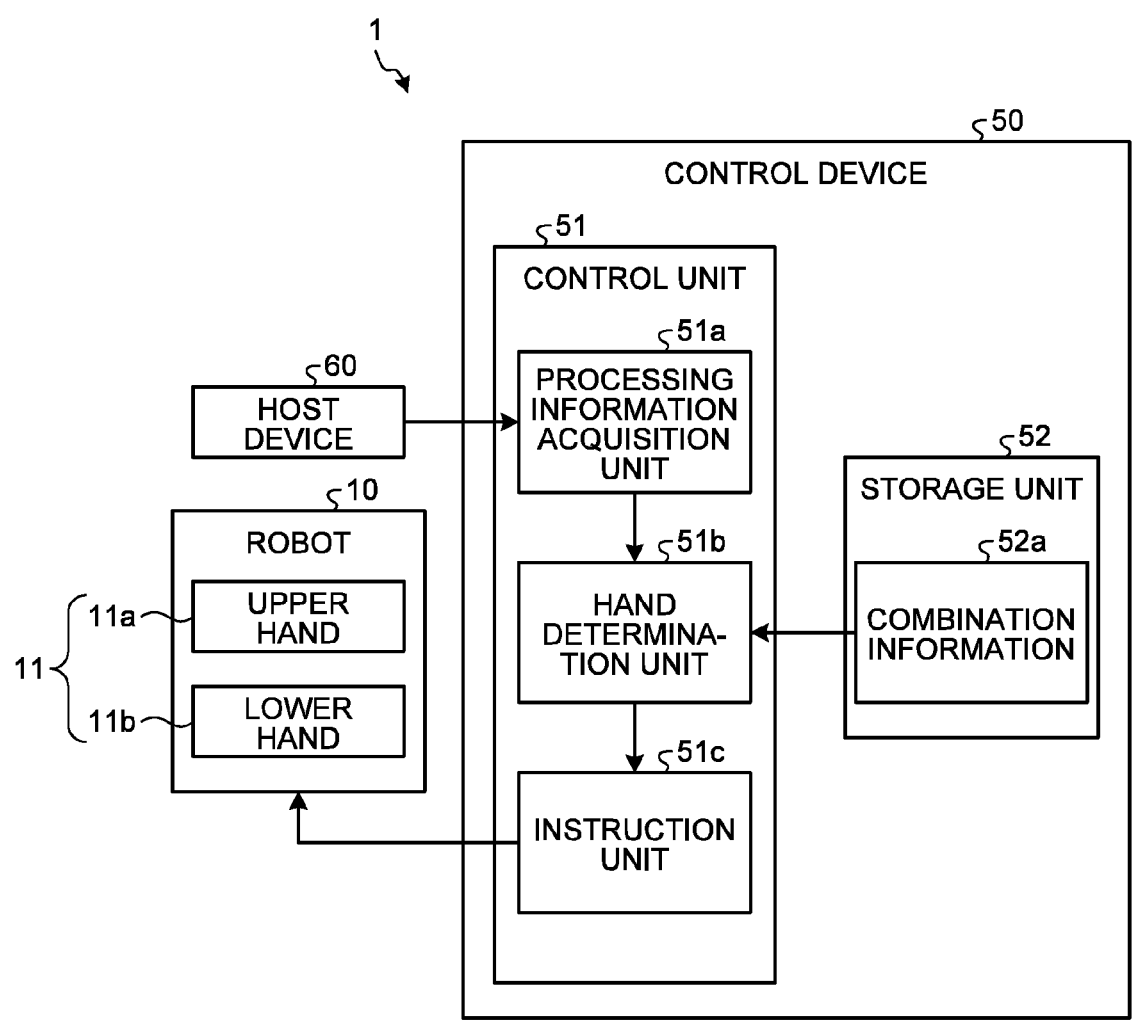
FIG. 4 is a block diagram of an exemplary configuration of the transfer system according to the embodiment.

FIG. 4 is a block diagram of the transfer system 1 according to the embodiment. In FIG. 4, only the components necessary for explanation of the control method employed in the transfer system 1 are illustrated, and illustration of general components is omitted.

The transfer system 1 includes the robot 10, the control device 50, and the host device 60 as illustrated in FIG. 4, which overlaps with a part of the description above. The robot 10 includes the hand 11 formed of the upper hand 11a and the lower hand 11b. Illustration of the other components of the transfer system 1 in FIG. 1 to FIG. 3 is omitted.

The control device 50 includes a control unit 51 and a storage unit 52. The control unit 51 includes a processing information acquisition unit 51a, a hand determination unit 51b (a determination unit), and an instruction unit 51c. The storage unit 52 stores therein combination information 52a.

Because the robot 10 and the hand 11 have already been described, a detailed explanation thereof will be omitted.

The control unit 51 controls the control device 50 collectively. The processing information acquisition unit 51a acquires information (hereinafter, referred to as "processing information") on processing that is to be performed and for which the wafer W is to be supplied and transferred based on the instruction data from the host device 60, for example.

The processing information includes information, such as a "temperature change allowance possibility" indicating whether the wafer W before processing allows a temperature change, a "temperature type" indicating whether the processing to be performed is processing at normal temperature or processing at abnormal temperature, and the strength of the downflow.

It can also be said that the "temperature type" indicates the temperature of the wafers W to be held on the upper hand 11a and the lower hand 11b. The "strength" of the downflow can also be referred to as a "magnitude" of the amount of control performed on the downflow.

The processing information acquisition unit 51a notifies the hand determination unit 51b of the processing information thus acquired.

Based on the processing information received from the processing information acquisition unit 51a and the combination information 52a of the storage unit 52, the hand determination unit 51b determines uses of the upper hand 11a and the lower hand 11b in the processing to be performed. The hand determination unit 51b then requests the instruction unit 51c to operate the robot 10 in accordance with the uses of the upper hand 11a and the lower hand 11b thus determined.

The combination information 52a can be simply formed as an information table specifying the uses of the upper hand 11a and the lower hand 11b under predetermined conditions. In this case, the hand determination unit 51b determines the uses of the upper hand 11a and the lower hand 11b based on the combination information 52a that matches conditions of the processing information thus received.

An example of the combination information 52a will now be described with reference to FIG. 5. FIG. 5 is a view of an example of the combination information 52a.

As illustrated in FIG. 5, the combination information 52a includes an item of the "temperature change allowance possibility", an item of the "temperature type", an item of the "downflow", an item of the "upper hand", and an item of the "lower hand", for example.

The item of the "temperature change allowance possibility" stores therein a stored value indicating whether the wafer W before the processing allows a temperature change. In FIG. 5, the "temperature change allowance possibility" is parameterized by two values of "impossible" and "possible", for example.

The item of the "temperature type" stores therein a stored value indicating a temperature type of the processing to be performed. In FIG. 5, for example, the "temperature type" is broadly classified into "abnormal temperature" and "normal temperature", and the "abnormal temperature" is further divided into "high temperature" and "low temperature". Note that "arbitrary" indicates that any "temperature type" can be employed.

The item of the "downflow" stores therein a stored value indicating the strength of the downflow managed by the host device 60. In FIG. 5, for example, the strength of downflow is broadly classified into "strong" and "weak". Note that "arbitrary" indicates that any strength of the downflow can be employed.

The item of the "upper hand" and the item of the "lower hand" store therein stored values indicating the uses of the upper hand 11a and the lower hand 11b, respectively, determined by combination of the "temperature change allowance possibility", the "temperature type", and the "downflow". In FIG. 5, the item of the "upper hand" and the item of the "lower hand" store therein stored values indicating whether the upper hand 11a and the lower hand 11b are used for the wafer W "before the processing" or the wafer W "after the processing", respectively, for example.

Figure 6A:
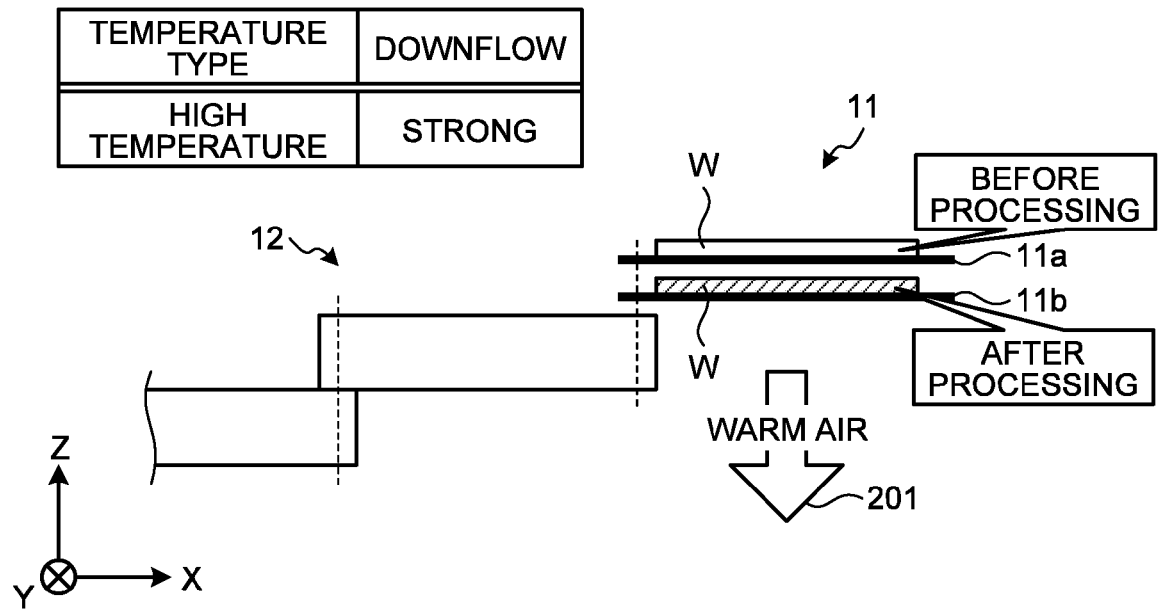
FIG. 6A, FIG. 6B, and FIG. 6C are views for a supplementary explanation of the combination information.
Figure 6B:
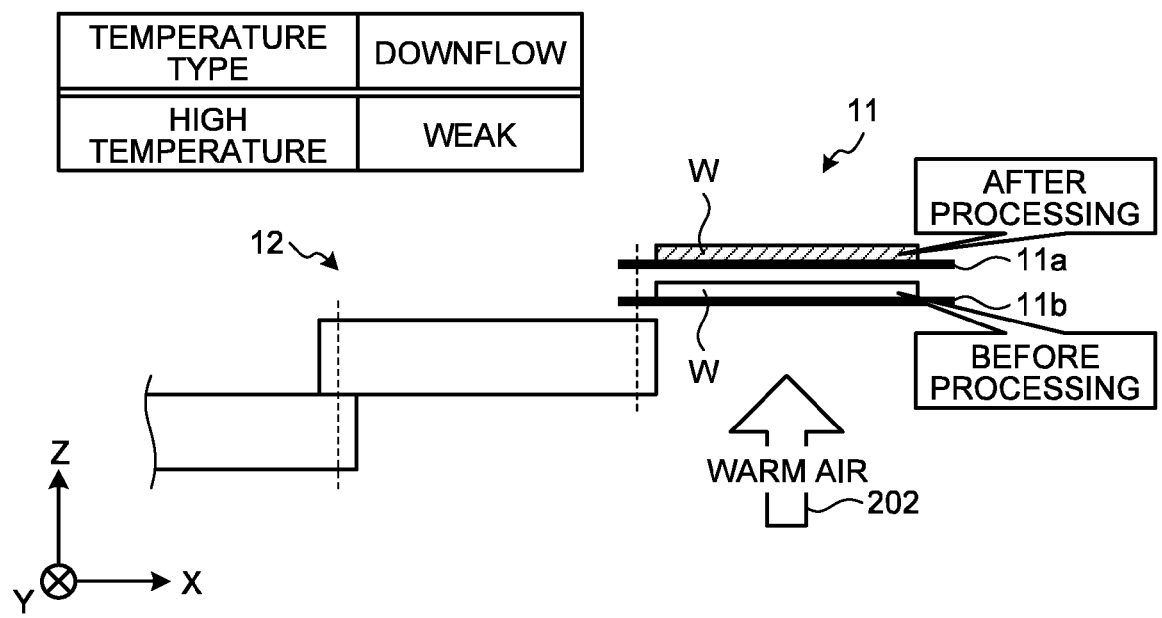
Figure 6C:
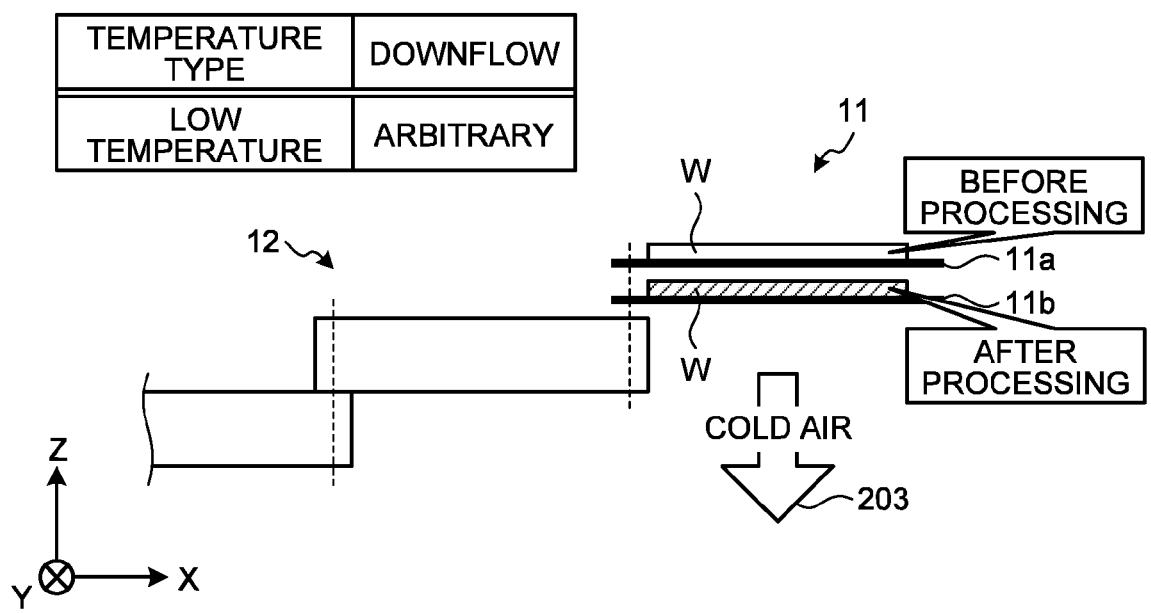

The combination information 52a will be explained more specifically with reference to FIG. 6A to FIG. 6C. FIG. 6A to FIG. 6C are views for a supplementary explanation of the combination information 52a. In FIG. 6A to FIG. 6C, a part of the hand 11 and the arm unit 12 is illustrated schematically from the negative side of the Y-axis. In terms of visual supplementation, the wafer W before the processing is illustrated with no pattern, and the wafer W after the processing is illustrated with a shaded pattern.

An assumption is made that the "temperature change allowance possibility" is "impossible", that is, the wafer W before the processing does not allow a temperature change.

As illustrated in FIG. 6A, if the "temperature type" of the processing to be performed is "high temperature" and the "downflow" is "strong", "warm air" is highly likely to descend by pushing force of the "strong" downflow (refer to an arrow 201 in FIG. 6A).

In this case, as illustrated in FIG. 6A, by using the upper hand 11a for the wafer W "before the processing" and using the lower hand 11b for the wafer W "after the processing", it is possible to suppress the effect of the high temperature of the wafer W "after the processing" on the wafer W "before the processing".

Therefore, in a P1 row (refer to FIG. 5) of the combination information 52a corresponding to this case, it is preferable that a stored value indicating "before the processing" be stored in the "upper hand" and that a stored value indicating "after the processing" be stored in the "lower hand".

As illustrated in FIG. 6B, if the "temperature type" of the processing to be performed is "high temperature" and the "downflow" is "weak", "warm air" is highly likely to ascend similarly to the heat convection in the atmosphere without being affected by the downflow (refer to an arrow 202 in FIG. 6B).

In this case, as illustrated in FIG. 6B, by using the upper hand 11a for the wafer W "after the processing" and using the lower hand 11b for the wafer W "before the processing", it is possible to suppress the effect of the high temperature of the wafer W "after the processing" on the wafer W "before the processing".

Therefore, in a P2 row (refer to FIG. 5) of the combination information 52a corresponding to this case, it is preferable that a stored value indicating "after the processing" be stored in the "upper hand" and that a stored value indicating "before the processing" be stored in the "lower hand".

As illustrated in FIG. 6C, if the "temperature type" of the processing to be performed is "low temperature", "cold air" is highly likely to descend similarly to the heat convection in the atmosphere regardless of the strength of the downflow (that is, the "downflow" is "arbitrary") (refer to an arrow 203 in FIG. 6C).

In this case, as illustrated in FIG. 6C, by using the upper hand 11a for the wafer W "before the processing" and using the lower hand 11b for the wafer W "after the processing", it is possible to suppress the effect of the low temperature of the wafer W "after the processing" on the wafer W "before the processing".

Therefore, in a P3 row (refer to FIG. 5) of the combination information 52a corresponding to this case, it is preferable that a stored value indicating "before the processing" be stored in the "upper hand" and that a stored value indicating "after the processing" be stored in the "lower hand".

As illustrated in a P4 row of the combination information 52a in FIG. 5, even in the case where the "temperature change allowance possibility" is "impossible", if the "temperature type" is "normal temperature", the wafer W is not affected by a temperature change in the first place. Therefore, both the upper hand 11a and the lower hand 11b can be used in an "arbitrary" manner.

Furthermore, as illustrated in a P5 row of the combination information 52a in FIG. 5, if the "temperature change allowance possibility" is "possible", no effect of temperature change needs to be considered in the first place. Therefore, also in this case, both the upper hand 11a and the lower hand 11b can be used in an "arbitrary" manner.

In FIG. 5, for convenience of the explanation, the stored value in each item of the combination information 52a is represented by a text format, such as "impossible" and "possible". However, it is not intended to limit the data format. Furthermore, relative expressions, such as the "abnormal temperature" and the "normal temperature", and "strong" and "weak", are not intended to limit the relationship between the pieces of data. Alternatively, specific numerical values of temperature and an air volume may be used, for example.

Referring back to FIG. 4, the instruction unit 51c will now be described. The instruction unit 51c instructs the robot 10 to operate in accordance with the instruction request received from the hand determination unit 51b.

The storage unit 52 is a storage device, such as a hard disk drive and a non-volatile memory, and stores therein the combination information 52a. Because the combination information 52a has already been described in detail, the explanation thereof will be omitted.

The configuration of the control device 50 may be realized without storing the combination information 52a by using a program logic and a wired logic, for example, such that the hand determination unit 51b can perform the hand determination processing nearly the same as that performed in the case where the hand determination unit 51b uses the combination information 52a.

In FIG. 4, one control device 50 is illustrated. Alternatively, the control device 50 may be configured as a plurality of independent devices that communicate with one another.

Figure 7:
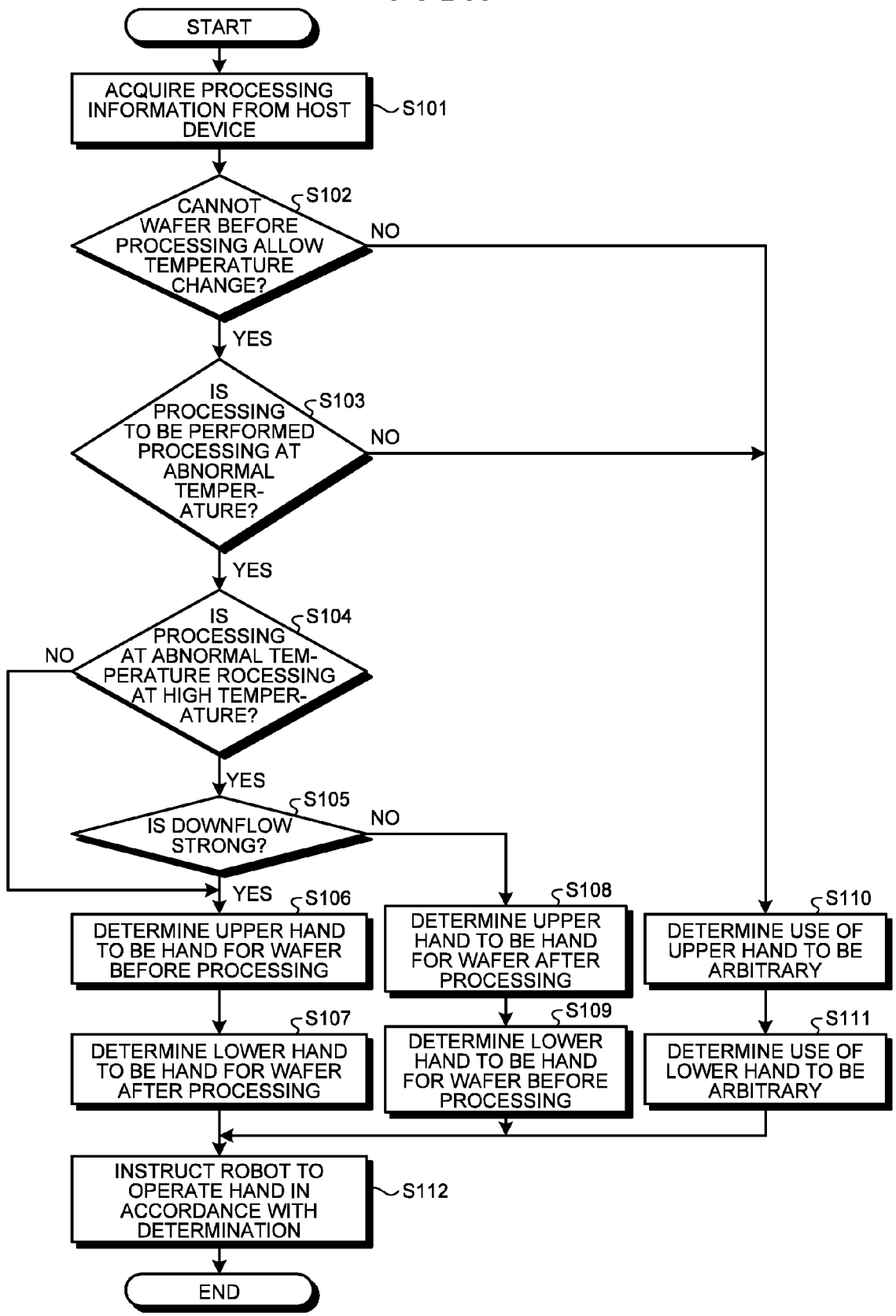
FIG. 7 is a flowchart of a process performed by the transfer system according to the embodiment.

A process performed by the transfer system 1 according to the embodiment will now be described with reference to FIG. 7. FIG. 7 is a flowchart of a process performed by the transfer system 1 according to the embodiment.

As illustrated in FIG. 7, the processing information acquisition unit 51a acquires processing information based on instruction data from the host device 60 (Step S101). Based on the processing information thus acquired, the hand determination unit 51b determines whether the wafer W before the processing cannot allow a temperature change, that is, whether the temperature change allowance possibility is impossible (Step S102).

If the temperature change allowance possibility is impossible (Yes at Step S102), the hand determination unit 51b determines whether the processing to be performed is processing at abnormal temperature (Step S103).

If the processing to be performed is processing at abnormal temperature (Yes at Step S103), the hand determination unit 51b determines whether the processing at abnormal temperature is processing at high temperature (Step S104).

If the processing at abnormal temperature is processing at high temperature (Yes at Step S104), the hand determination unit 51b determines whether the downflow is strong (Step S105).

If the downflow is strong (Yes at Step S105), the hand determination unit 51b determines the upper hand 11a to be a hand for the wafer W before the processing (Step S106). Furthermore, the hand determination unit 51b determines the lower hand 11b to be a hand for the wafer W after the processing (Step S107).

If the processing at abnormal temperature does not satisfy the determination conditions at Step S104 (that is, the processing at abnormal temperature is processing at low temperature) (No at Step S104), the hand determination unit 51b also determines the upper hand 11a to be a hand for the wafer W before the processing (Step S106). Furthermore, the hand determination unit 51b determines the lower hand 11b to be a hand for the wafer W after the processing (Step S107).

If the downflow does not satisfy the determination conditions at Step 5105 (that is, the downflow is weak) (No at Step S105), the hand determination unit 51b determines the upper hand 11a to be a hand for the wafer W after the processing (Step S108). Furthermore, the hand determination unit 51b determines the lower hand 11b to be a hand for the wafer W before the processing (Step S109).

If the processing to be performed does not satisfy the determination conditions at Step 5103 (that is, the processing to be performed is processing at normal temperature) (No at Step S103), the hand determination unit 51b determines use of the upper hand 11a to be arbitrary (Step S110). In addition, the hand determination unit 51b determines use of the lower hand 11b to be arbitrary (Step S111).

If the temperature change allowance possibility does not satisfy the determination conditions at Step S102 (that is, the temperature change allowance possibility is possible) (No at Step S102), the hand determination unit 51b also determines use of the upper hand 11a to be arbitrary (Step S110). In addition, the hand determination unit 51b determines use of the lower hand 11b to be arbitrary (Step S111).

The hand determination unit 51b can make the determination described above based on the combination information 52a of the storage unit 52.

The hand determination unit 51b then requests the instruction unit 51c to move the hand 11 in accordance with the uses thus determined, and the instruction unit 51c instructs the robot 10 to operate in accordance with the request thus received (Step S112). Subsequently, the processing is terminated.

As described above, the transfer system according to the embodiment includes a robot and a determination unit. The robot includes hands that hold a wafer and that are located at different heights. Based on a combination of the temperature of the wafer to be held by each of the hands, the determination unit determines the hands that hold the wafer.

Therefore, the transfer system according to the embodiment can transfer substrates while preventing temperature of a substrate at abnormal temperature from affecting a substrate at normal temperature.

In the embodiment, the temperature and the strength of the downflow are acquired via a host device, for example. Alternatively, an EFEM and the robot may include a detection unit that detects the temperature and the strength of the downflow, for example.

In the embodiment, the explanation has been made of the case where two hands are provided to the tip of one arm corresponding to a single arm, for example. However, the number of hands is not restricted, and three or more hands may be provided.

In the embodiment, the explanation has been made of a single-arm robot, for example. Alternatively, the present embodiment may be applied to a multi-arm robot that has two or more arms. In this case, the tip of one arm corresponding to a single arm only needs to be provided with one hand. In other words, the present embodiment can be applied to the case where the hands of at least two arms overlap with each other.

In the embodiment, the explanation has been made of the case where a workpiece serving as a target to be transferred is a substrate and the substrate is mainly a wafer, for example. Needless to say, the present embodiment can be applied to a substrate of any type. The substrate may be a glass substrate for a liquid crystal panel display, for example. Furthermore, the substrate is not necessary a substrate as long as it is a workpiece in a thin plate shape.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transfer system comprising:
   a robot including robot hands that hold a workpiece in a thin plate shape and that are located at different heights; and
   a determination unit that determines the robot hands that hold the workpiece based on a combination of a temperature of the workpiece to be held by each of the robot hands and a strength of a downflow of air in a space to which the robot is provided.

2. The transfer system according to claim 1, wherein the determination unit determines the robot hands that hold the workpiece based on whether the workpiece with which the temperature is a normal temperature allows a temperature change.

3. The transfer system according to claim 2, wherein the robot hands are provided on a tip of an arm that moves in a horizontal direction in a manner close to each other so as to rotate individually about a common pivot.

4. The transfer system according to claim 1, wherein the robot hands are provided on a tip of an arm that moves in a horizontal direction in a manner close to each other so as to rotate individually about a common pivot.

5. The transfer system according to claim 1, wherein the determination unit divides the temperature of the workpiece into normal temperature and abnormal temperature to create the combination.

6. The transfer system according to claim 1, wherein the determination unit divides the temperature of the workpiece into normal temperature, high temperature higher than the normal temperature, and low temperature lower than the normal temperature to create the combination.

7. The transfer system according to claim 1, wherein the determination unit acquires the temperature of the workpiece to be held by each of the robot hands based on instruction data that specifies an operation of the robot.

8. The transfer system according to claim 1,
wherein the determination unit includes:
   a storage unit that stores information of the robot hands, the information of the robot hands associated with temperature information and strength information of a downflow of air in a space in which the robot is provided, and
   an information acquisition unit that acquires information regarding the temperature of the workpiece to be held by each of the robot hands and information regarding the strength of the downflow of air in the space to which the robot is provided, and
wherein the determination unit determines the robot hands that hold the workpiece to be held by each of the robot hands by comparing the information stored in the storage unit with the information acquired by the information acquisition unit.

9. The transfer system according to claim 1,
wherein the robot hands include a first robot hand located at an upper course side with respect to the downflow and a second robot hand located at a lower course side with respect to the downflow,
wherein the robot hands hold a plurality of workpieces, the workpieces including a first workpiece of a high temperature and a second workpiece of a low temperature, and
wherein the determination unit determines the second robot hand as a robot hand that holds the first workpiece when the downflow of air is strong, and the determination unit determines the first robot hand as a robot hand that holds the first workpiece when the downflow of air is weak.

10. The transfer system according to claim 9, wherein the determination unit determines the first robot hand as a robot hand that holds the second workpiece when the downflow of air is strong, and the determination unit determines the second robot hand as a robot hand that holds the second workpiece when the downflow of air is weak.

11. The transfer system according to claim 10, wherein the first workpiece is a workpiece after a hot treatment is performed and the second workpiece is a workpiece before the hot treatment is performed.

12. A transfer system comprising a determination means that determines, based on a combination of a temperature of a workpiece in a thin plate shape to be held by robot hands of a robot and a strength of a downflow of air in a space to which the robot is provided, the robot including the robot hands that hold the workpiece and that are located at different heights, the robot hands that hold the workpiece.

\* \* \* \* \*